(12) United States Patent
Christoffers et al.

(10) Patent No.: US 7,218,178 B2
(45) Date of Patent: May 15, 2007

(54) FREQUENCY GENERATOR WITH A PHASE LOCKED LOOP

(75) Inventors: Niels Christoffers, Duisburg (DE);
Rainer Kokozinski, Oberhausen (DE);
Bedrich Hosticka, Muehlheim (DE);
Stephan Kolnsberg, Krefeld (DE)

(73) Assignee: Fraunhofer-Gesellschaft zur Foerderung der angewandten Forschunge e.V (DE)

( * ) Notice: Subject to any disclaimer, the term of this patent is extended or adjusted under 35 U.S.C. 154(b) by 0 days.

(21) Appl. No.: 11/234,324

(22) Filed: Sep. 23, 2005

(65) Prior Publication Data

US 2006/0077009 A1     Apr. 13, 2006

Related U.S. Application Data

(63) Continuation of application No. PCT/EP2004/003261, filed on Mar. 26, 2004.

(30) Foreign Application Priority Data

Mar. 27, 2003   (DE) ................. 103 13 884

(51) Int. Cl.
*H03L 7/093*   (2006.01)
*H03L 7/18*    (2006.01)

(52) U.S. Cl. ................. 331/17; 331/8; 331/16

(58) Field of Classification Search ........... 331/1 A, 331/8, 16–18, 25; 327/156–159; 332/127; 360/51; 375/376; 455/260
See application file for complete search history.

(56) References Cited

U.S. PATENT DOCUMENTS

| | | | | |
|---|---|---|---|---|
| 3,286,188 A | * | 11/1966 | Castellano, Jr. | ............. 329/325 |
| 3,551,829 A | * | 12/1970 | Haggai | ................. 329/325 |
| 3,611,168 A | * | 10/1971 | Haggai | ................. 329/325 |
| 3,740,671 A | | 6/1973 | Crow et al. | |
| 5,977,838 A | | 11/1999 | Nagoya et al. | |
| 5,983,077 A | | 11/1999 | Dent | |
| 6,008,703 A | | 12/1999 | Perrott et al. | |
| 2006/0077009 A1 | * | 4/2006 | Christoffers et al. | .......... 331/16 |

FOREIGN PATENT DOCUMENTS

DE   102 55 863 A1   6/2004

OTHER PUBLICATIONS

Bram De Muer, and Michael S. J. Steyaert; "A CMOS Monolithic Controlled Fractional—N Frequency Synthesizer for DCS-1800"; IEEE Journal of Solid-State Circuits, vol. 37, No. 7, Jul. 2002.
Maxim/Dallas Direct; "Microprocessor Programmable Universal Active Filters"; 19 0352, Rev 2, Jul. 2002.
PCT/ISA/210; PCT/EP2004/003261; Mar. 26, 2004.
International Preliminary Report on Patentability and translation of PCT Written Opinion of the Int'l Searching Authority; PCT/EP2004/003261; Mar. 26, 2004.

* cited by examiner

*Primary Examiner*—David Mis
(74) *Attorney, Agent, or Firm*—Beyer Weaver LLP

(57) ABSTRACT

A frequency generator with a phase locked loop includes a loop filter, the transfer function of which has a pair of complex conjugated poles. The present invention provides an optimum and greatly improved compromise, in particular as opposed to the prior art, between phase noise and settling time of the phase locked loop of the frequency generator.

19 Claims, 7 Drawing Sheets

FREQUENCY GENERATOR WITH A PHASE LOCKED LOOP

CROSS-REFERENCE TO RELATED APPLICATION

This application is a continuation of co-pending International Application No. PCT/EP2004/003261, filed Mar. 26, 2004, which designated the United States and was not published in English and is incorporated herein by reference in its entirety.

BACKGROUND OF THE INVENTION

1. Field of the Invention

This invention relates to a frequency generator with a phase locked loop with a loop filter, to a method of generating an oscillating output signal, as well as a method and an apparatus for designing a frequency generator.

2. Description of the Related Art

Frequency generators with phase locked loop (PLL) are employed in many areas, for example in a digital wireless communication system, such as Bluetooth. In such a communication system, a frequency generator generates the carrier signal used for modulation in the transmitter or in transmitting and for demodulation in the receiver or in receiving. A frequency band is associated with each communication system. The communication system may utilize all frequencies within this frequency band to transfer data or information from the transmitter to the receiver. The power of signals the transmitter generates outside the associated frequency band is not allowed to exceed a certain limit, in order not to disturb communication systems utilizing neighboring frequency bands. Signal portions outside the associated frequency band are the greater, the greater the phase noise $S_\phi$ with which the carrier or the carrier frequency is burdened. For this reason, the phase noise $S_\phi$ has to lie below a predetermined limit $S_{\phi max}$ at a certain frequency offset $\Delta f_{sp}$ from the carrier.

A further requirement for a frequency generator is that, after announcement of a to-be-output or desired output frequency or target frequency, it adjusts the output frequency sufficiently accurately to the target output frequency within an as-short-as-possible settling time. There are still further requirements, which among other things depend on the modulation method used. In an FSK method (FSK=frequency shift keying), for example, direct modulation capability of the output frequency of the frequency generator is advantageous and desired.

FIG. 10 is a schematic circuit diagram showing an example for a frequency generator based on a phase locked loop. A phase/frequency detector PFD 10 includes a reference signal input 12 for receiving a reference signal with a reference frequency $f_{ref}$, a comparison signal input for receiving a comparison signal with a comparison frequency $f_1$, and a control output 16 for outputting an oscillator control signal. The phase/frequency detector then forms the oscillator control signal depending on the difference between the comparison frequency $f_1$ of the comparison signal present at the comparison signal input 14 and the reference frequency $f_{ref}$ of the reference signal present at the reference signal input 12.

A loop filter 20 includes an input 22 connected to the control output 16 of the phase/frequency detector 10 and an output 24. The loop filter 20 usually is a low-pass filter, mostly an RC filter. It filters the oscillator control signal received at the input 22 from the phase/frequency detector 10, in order to generate a filtered oscillator control signal, which it outputs at the output 24. An oscillator 30 includes an input 32 connected to the output 24 of the loop filter 20 and an output 34. The oscillator 30 receives the filtered oscillator control signal from the loop filter 20 at its input 32 and generates an output signal with an output frequency $f_{out}$ at its output 34. The oscillator 30 generates the output signal so that the output frequency $f_{out}$ depends on the filtered oscillator control signal.

The oscillator 30, for example, is a voltage-controlled oscillator (VCO). A VCO usually includes a varactor diode, the capacity of which depends on a present direct voltage. The varactor diode forms the capacity in an LC resonant circuit. The filtered oscillator control signal is a voltage signal applied to the varactor diode (in reverse direction). The greater the applied voltage, the greater the space charge zone and the smaller the electric capacitance between the electrodes in the varactor diode. The smaller the capacitance of the varactor diode, the greater the natural frequency or resonance frequency or output frequency $f_{out}$ of the VCO 30.

A frequency divider 40 includes an input 42 connected to the output 34 of the oscillator 30, an output 44 connected to the comparison signal input 14 of the phase/frequency detector 10, and a control input 46. The frequency divider receives the output signal with the output frequency $f_{out}$ from the output 34 of the oscillator 30 at its input 42 and a frequency factor control signal at its control input 46. The frequency factor control signal represents a frequency factor, which is an integer fraction 1/N of 1. The integer N will be referred to as divisor in the following. The frequency divider 40 generates the comparison signal with the comparison frequency $f_1$ from the output signal with the output frequency $f_{out}$ by a frequency division, wherein the comparison frequency $f_1$ is smaller than the output frequency $f_{out}$ by the frequency factor 1/N, $f_1 = f_{out}/N$.

The frequency generator illustrated in FIG. 10 further comprises a $\Sigma\Delta$ modulator 50. The $\Sigma\Delta$ modulator 50 includes an input 52, a reference signal input 54, and a control output 56 connected to the control input 46 of the frequency divider 40. The $\Sigma\Delta$ modulator receives, at its input 50, a signal representing a desired frequency factor $1/N_{frac}$, which does not have to be an integer fraction of 1, as opposed to the frequency factor processed by the frequency divider 40. The $\Sigma\Delta$ modulator receives, at its reference signal input 54, the same reference signal the phase/frequency detector 10 receives at its reference signal input 12. The reference signal serves as clock signal for the $\Sigma\Delta$ modulator.

The desired frequency factor $1/N_{frac}$ or its inverse, the desired divisor $N_{frac}$, are preferably passed to the $\Sigma\Delta$ modulator 50 in form of an input word K with the binary input word width k at its input 52, wherein $N_{frac} = N_0 + xK/2^k$ applies. Here, $N_0$ is a natural number and x+1 the number of (integer) moduli made available by the frequency divider 40. The frequency divider 40 divides the output frequency $f_{out}$ by a divisor N, which takes on one of the integer values $N_0$, $N_0+1$, $N_0+2$, ..., $N_0+x$. If, for example, $f_{ref}=8$ MHz, $N_0=124$, x=2, and k=4 applies, the input word K may take on the values 0, 1, 2, ..., 15, the divisor N the values N=124, N=125, N=126, and the frequency factor 1/N the values $1/N=1/124$, $1/N=1/125$, and $1/N=1/126$.

If the $\Sigma\Delta$ modulator 50 receives an input word K=0, 1, 2, ..., 15 at its input 52, it controls the frequency divider 40 so that the divisor N corresponds to the desired divisor $N_{frac}$, i.e. one of the values 124,0,124,125,124,250, 124,375, ..., 125,750 or 125,875, in temporal average. If the desired divisor $N_{frac}$ is integer (K=0, $N_{frac}=124$ and K=8, $N_{frac}=125$), the ΣΔ modulator 50 generates a frequency factor control signal at its control output 56, which causes the corresponding frequency factor (1/124 or 1/125) to be adjusted in the frequency divider 40 in constant manner. If the desired divisor $N_{frac}$ is not an integer (K=1, $N_{frac}=124$, 125 to K=7, $N_{frac}=124,875$ and K=9, $N_{frac}=125,125$ to K=1, $N_{frac}=125,875$), the ΣΔ modulator 50 generates, at its control output 56, a time-variable frequency factor control signal causing the frequency divider 40 to alternatingly set the divisor N to one of the (integer) values 124, 125, 126. The ΣΔ modulator 50 determines the portion the individual frequency factors have of the overall time, so that the temporal average of the frequency factors adjusted by the frequency divider 40 corresponds to the desired frequency factor $1/N_{frac}$. In other words, the direct component of the frequency factor control signal generated by the ΣΔ modulator 50 ensures that the (mean) output frequency of the output signal is $f_{out}=N_{frac} f_{ref}$.

While, without the ΣΔ modulator 50, only the output frequencies $f_{out}=992$ MHz, 1000 MHz, 1008 MHz would be adjustable by the frequency divider 40, the ΣΔ modulator 50 controls the frequency divider 40 so that, with the numerical example mentioned, 16 different output frequencies at a distance of 1 MHz can be generated, $f_{out}=992$ MHz (K=0), 993 MHz (K=1), 994 MHz (K=2), . . . , 1007 MHz (K=15).

In the embodiment illustrated, a circuit of two current sources 60, 62 and two switches 64, 66 is connected between the control output 16 of the phase/frequency detector 10 and the input 22 of the loop filter 20. The first current source 60, the first switch 64, the second switch 66 and the second current source 62 are connected in series between a supply potential terminal and ground in this arrangement. The switches 64, 66 are connected to the control output 16 of the phase/frequency detector 10 and are controlled individually and depending on the reference frequency $f_{ref}$ and the comparison frequency $f_1$ by the phase/frequency detector 10. They convert the oscillator control signal generated by the phase/frequency detector 10 to a modified oscillator control signal, which is fed to the loop filter 20. Functionally, the arrangement of the current sources 60, 62 and the switches 64, 66 may be regarded as a constituent of the phase/frequency detector.

The phase/frequency detector 10, the loop filter 20, the oscillator, and the frequency divider 40 form a locked loop. The oscillator control signal generated by the phase/frequency detector 10 due to a phase difference between the reference signal and the comparison signal controls the oscillator 30 so that the comparison signal has a constant phase relation to the reference signal.

A further important property of the ΣΔ modulator is that it controls the integer divisors N, N+1, N+2, . . . , N+x (in the concrete numerical example: 124, 125, 126) of the frequency divider 40 in a quasi-random sequence so that the quantization noise of the ΣΔ modulator 50 has an advantageous noise spectrum. The advantageous noise spectrum contains little power at low-noise frequencies and much power at high-noise frequencies. These high-noise frequencies, however, are largely suppressed or removed by the loop filter.

An advantage of the ΣΔ modulator fractional-N frequency generator or frequency generator with the ΣΔ modulator described on the basis of FIG. 10 is that it may be operated at an almost arbitrary reference frequency $f_{ref}$ or the reference frequency $f_{ref}$ does not restrict the series of possible output frequencies $f_{out}$ or their frequency distance. Its phase noise and its settling time are substantially determined by the transfer function $H_{PLL}(s)$ of the phase locked loop. The ΣΔ fractional-N frequency generator from FIG. 10 can further be modulated easily, for example by means of pre-emphasis methods or two-point modulation.

If the phase locked loop 10, 20, 30, 40 and particularly its loop filter 20 is narrow band, the constant switching of the frequency divider 40 between various frequency factors 1/N or between various divisors N caused by the ΣΔ modulator 50 has a weaker effect on the output frequency $f_{out}$ than if the phase locked loop is broadband. On the other hand, the more broadband it is, the quicker the phase locked loop is capable of following a desired change of the output frequency $f_{out}$. Phase noise and settling time of the phase locked loop and the frequency generator thus have to be balanced against each other. How difficult it is to find a compromise here, however, depends on the amplification $K_{VCO}$ of the VCO 30, the properties of the phase/frequency detector 10 and of the loop filter 20, among other things.

There is a series of influences on the phase noise of a ΣΔ fractional-N frequency generator. Among those are the phase noise of the free-running oscillator 30, the phase noise of the reference signal, the jitter of the frequency divider 40, the noise of the phase/frequency detector 10 and of the loop filter 20. Usually dominant, however, is the quantization noise $N_q$ of the ΣΔ modulator 50. In their article "A CMOS Monolithic ΣΔ-Controlled Fractional-N Frequency Synthesizer for DCS-1800" (IEEE J. Solid-State Circuits, vol. 37, No. 7, pp. 835–44, 2002), D. de Muer and M. S. J. Steyaert indicate an approximation formula for the contribution of the quantization noise $N_q$ of the ΣΔ modulator to the phase noise $S_\phi$ of the ΣΔ fractional-N frequency generator. From this approximation formula, the inequality $$|H_{PLL}(2\pi\Delta f_{sp})| < \sqrt{S_{\phi max}(\Delta f_{sp}) \frac{3 f_{ref} |1-z^{-1}|^2}{\Delta^2 \pi^2 |H_q(z)|^2}}$$

may be derived for the magnitude of the transfer function. If this inequality is satisfied, the phase noise $S_\phi$ of the frequency generator at a frequency offset $\Delta f_{sp}$ from the carrier or a carrier frequency is not greater than the limit $S_{\phi max}$. Here, $H_{PLL}(s)$ is the transfer function of the phase locked loop, $f_{ref}$ the reference frequency, $H_q(Z)$ the noise-forming function of the ΣΔ modulator, $z=\exp(j2\pi\Delta f_{sp}/f_{ref})$, $\Delta=x/(2^{B-1})$, and B the width of the output word of the ΣΔ modulator.

The settling time of a frequency generator is, according to definition, the time the frequency generator needs after announcement of the frequency to be output, to adjust the output frequency $f_{out}$ accurately up to a relative error α. If the phase difference between the reference signal and the comparison signal remains smaller than 2π during the settling process, the relative frequency error may be calculated by determining the response of the so-called error transfer function $H_e(s)=(1-H_{PLL}(s))$ to a jump of the height $\Delta N_{frac}/N_{frac}$ (at a time instant t=0). The settling time then corresponds to the earliest time instant after which the magnitude of the relative frequency error remains smaller than α.

SUMMARY OF THE INVENTION

It is an object of the present invention to provide a frequency generator, a method of generating an oscillating output signal, a method, a computer program, and an apparatus for designing a frequency generator, which have or provide little phase noise and short settling time.

In accordance with a first aspect, the present invention provides a frequency generator, having: a phase locked loop with a loop filter, wherein the loop filter is formed such that a transfer function of the loop filter has a pair of complex conjugated poles.

In accordance with a second aspect, the present invention provides a method of generating an oscillating output signal with an output frequency from a reference signal with a reference frequency, with the steps of: generating the oscillating output signal; generating a comparison signal from the oscillating output signal, wherein a comparison frequency of the comparison signal differs from the output frequency by a frequency factor; comparing the comparison frequency with the reference frequency or a phase of the comparison signal with a phase of the reference signal, in order to generate an oscillator control signal, which depends on the difference of the comparison frequency and the reference frequency or on the difference of the phase of the comparison signal and the phase of the reference signal; filtering the oscillator control signal with a loop filter, in order to obtain a filtered oscillator control signal, wherein the transfer function of the loop filter has a pair of complex conjugated poles; and controlling the output frequency of the output signal depending on the filtered oscillator control signal.

In accordance with a third aspect, the present invention provides a method of designing a frequency generator with a phase locked loop with a loop filter, with the steps of: determining a maximum phase noise of the phase locked loop and a frequency offset, wherein the phase noise of the phase locked loop is to be no more than equal to the maximum phase noise at the frequency offset from a carrier frequency; calculating a maximum magnitude of a transfer function $H_{PLL}(s)$ of the phase locked loop at the frequency offset from the maximum phase noise and the frequency offset; determining a pair of complex conjugated poles of a transfer function $H_{LF}(s)$ of the loop filter so that the magnitude of the transfer function $H_{PLL}(s)$ of the phase locked loop for the determined pair of complex conjugated poles is equal to the maximum magnitude and the settling time of the phase locked loop is minimal.

In accordance with a fourth aspect, the present invention provides a computer program with program code for performing, when the computer program is executed on a computer, the method of designing a frequency generator with a phase locked loop with a loop filter, with the steps of: determining a maximum phase noise of the phase locked loop and a frequency offset, wherein the phase noise of the phase locked loop is to be no more than equal to the maximum phase noise at the frequency offset from a carrier frequency; calculating a maximum magnitude of a transfer function $H_{PLL}(s)$ of the phase locked loop at the frequency offset from the maximum phase noise and the frequency offset; determining a pair of complex conjugated poles of a transfer function $H_{LF}(s)$ of the loop filter so that the magnitude of the transfer function $H_{PLL}(s)$ of the phase locked loop for the determined pair of complex conjugated poles is equal to the maximum magnitude and the settling time of the phase locked loop is minimal.

In accordance with a fifth aspect, the present invention provides an apparatus for designing a frequency generator with a phase locked loop with a loop filter, having: a maximum phase noise determinator for determining a maximum phase noise of the phase locked loop and a frequency offset, wherein the phase noise of the phase locked loop is to be no more than equal to the maximum phase noise at the frequency offset from a carrier frequency; a calculator for calculating a maximum magnitude of a transfer function of the phase locked loop at the frequency offset from the maximum phase noise and the frequency offset; and a pole determinator for determining a pair of complex conjugated poles of a transfer function of the loop filter, for which the magnitude of the transfer function of the phase locked loop is equal to the maximum magnitude and the settling time of the phase locked loop is minimal.

The present invention is based on the finding to use a loop filter the transfer function of which comprises a pair of complex conjugated poles. Furthermore, the present invention is based on the finding that these complex conjugated poles can be chosen so that the phase noise $S_\phi$ of the frequency generator does not exceed a predetermined limit at a certain frequency offset and at the same time the settling time of the frequency generator is minimized.

According to a preferred embodiment of the present invention, a frequency generator is designed with a phase locked loop. For this, as solution of the minimization object described with boundary conditions, at first poles and zeros of the transfer function of the phase locked loop are determined. From the poles and zeros of the transfer function of the phase locked loop, then the transfer function of the loop filter and its pair of complex conjugated poles may be determined.

An advantage of the present invention is that it provides an optimum and, particularly as opposed to the prior art, greatly enhanced compromise between phase noise and settling time of a phase locked loop of a frequency generator.

A further advantage is that the present invention provides a method for synthesis of a frequency generator with a phase locked loop.

According to preferred embodiments of the present invention, the loop filter includes a coil or an active filter to generate a pair of complex conjugated poles of the transfer function. Especially preferably, the loop filter includes a biquad filter or a current-mode biquad filter. The current-mode biquard filter is preferably constructed of transconductors. An advantage of the realization of the loop filter with a current-mode biquard filter is that this has an especially low power demand.

Preferably, the loop filter is synthesized from transconductors. This has the advantage that the individual transconductors only influence each other slightly. Different from, for example, the use of passive devices, such as resistors, capacitors, and coils for the synthesis of a filter, the synthesis process with the use of transconductors is relatively linear and uncomplicated.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 10:
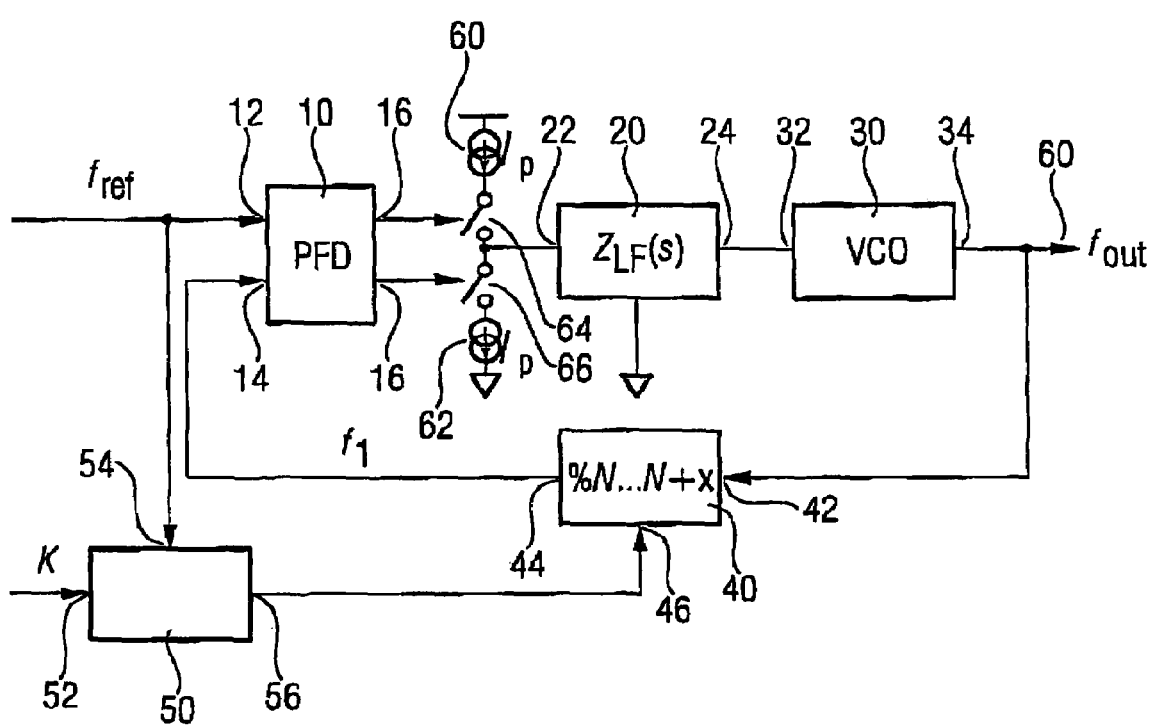
FIG. 10 is a schematic circuit diagram of a conventional frequency generator with a phase locked loop.

As has already been explained, both the settling time $T_{min}$ and the phase noise $S_\phi$ of the frequency generator are functions of the poles and zeros of the transfer function $H_{PLL}(s)$ of the phase locked loop. The transfer function $H_{PLL}(s)$ of the phase locked loop depends on the amplification $K_{VCO}$ of the oscillator 30 (FIG. 10), on the current $I_p$ of the current operated by the current sources, and on the transfer function $Z_{LF}(s)$ of the loop filter 20 as follows:

$$H_{PLL}(s) = \frac{\frac{K_{VCO}I_p}{2\pi}Z_{LF}(s)}{1 + \frac{K_{VCO}I_p}{2\pi}Z_{LF}(s)}$$

(c.f. F. M. Gardner: "Charge-Pump Phase-Lock Loops", IEEE Trans. Commun., vol. COM-28, pp. 1849–58, 1980). The transfer function of the loop filter of a type II N-th order phase locked loop has N−2 poles $s_{\infty LF,n}$ different from zero and a zero. Together with the factor $K_{VCO}I_p$, N independent variables exist, which may be mapped one-to-one to the poles $s_{\infty PLL,n}$ of the transfer function $H_{PLL}(s)$ of the phase locked loop. The poles $s_{\infty PLL,n}$ (n=1, 2, . . . , N) are represented as $$s_{\infty PLL,n} = s_N s_{\infty r,n},$$

wherein $s_N$ is a reference location on the negative portion of the real axis of the plane of numbers and $s_{\infty r,n}$ (n=1, 2, . . . , N) the relative locations of their poles in the complex plane of numbers with reference to the reference location $s_N$.

The transfer function $H_{o,PLL}(s)$ of the open type II phase locked loop is a simple function of the transimpedance $Z_{LF}(s)$ of the loop filter, $$H_{o,PLL}(s) = \frac{K_{VCO}I_p}{N_{frac}2\pi s}Z_{LF}(s).$$

The transimpedance $Z_{LF}(s)$ of the loop filter is represented as fraction $Z_{LF}(s)=P_{LF}(s)/Q_{LF}(s)$ of two polynomials $$P_{LF}(s) = p_{1,LF}s + p_{0,LF}$$

and $$Q_{LF}(s) = q_{N-1,LF}s^{N-1} + q_{N-2,LF}s^{N-2} + \ldots + q_{1,LF}s.$$

The connection between the transfer function $H_{PLL}(s)$ of the closed phase locked loop and the transfer function $H_{o,PLL}(s)$ of the opened phase locked loop is $$H_{PLL}(s) = \frac{P_{PLL}(s)}{Q_{PLL}(s)} = \frac{H_{o,PLL}(s)}{1 + H_{o,PLL}(s)}.$$

The coefficients $p_{n,LF}$ (n=0, 1) of the numerator polynomial $P_{LF}(s)$ and $q_{n,LF}$ (n=1, 2, . . . , N−1) of the denominator polynomial $Q_{LF}(s)$ of the loop filter may simply be determined from the coefficients $q_{n,PLL}$ (n=0, 1, 2, . . . , N) of the denominator polynomial $Q_{PLL}(s)$ of the transfer function $H_{PLL}(s)$ of the phase locked loop:

$$p_{n,LF} = \frac{2\pi N_{frac}}{K_{VCO}I_p}q_{n,PLL} \quad (n = 0, 1)$$

and $$q_{n,LF} = q_{n+1,PLL} \quad (n = 1, 2, \ldots, N-1).$$

It follows from the equations, that both the numerator polynomial $P_{LF}(s)$ and the denominator polynomial $Q_{LF}(s)$ of the transfer function $Z_{LF}(s)$ of the loop filter and the product $K_{VCO}I_p/N_{frac}$ can be calculated alone from the denominator polynomial $Q_{PLL}(s)$ of the transfer function $H_{PLL}(s)$ of the phase locked loop. Furthermore, it follows from the equations that the transfer function $H_{PLL}(s)$ of the phase locked loop has exactly one zero at $s_0=q_{1,PLL}/q_{0,PLL}$. This zero is not adjusted depending on the poles of the transfer function $H_{PLL}(s)$ of the transfer function of the phase locked loop. The knowledge of the poles $s_{\infty PLL,n}$ (n=1, 2, . . . , N) of the transfer function $H_{PLL}(s)$ of the phase locked loop or of their relative locations $s_{\infty r,n}$ is therefore sufficient to determine the transfer function $H_{PLL}(s)$ for an arbitrary s.

In a first synthesis step, that reference location $s_N$ for which the above inequality is satisfied with the equality sign is determined, $$|H_{PLL}(2\pi\Delta f_{sp})| = \sqrt{S_{\phi max}(\Delta f_{sp})\frac{3f_{ref}|1-z^{-1}|^2}{\Delta^2\pi^2|H_q(z)|^2}}.$$

According to the similarity theorem of the Laplace transform, the solution to this equation minimizes the settling time of the phase locked loop for given relative locations $s_{\infty r,n}$ (n=1, 2, . . . , N) of the poles.

That theorem of the relative pole locations $s_{\infty r,n}$ for which the settling time T is minimal (T=$T_{min}$) at the optimized reference location $s_N$ is then searched for with a numerical method. Such a numerical method is for example the Nelder-Mead-Algorithmus (J. C. Lagarias et al.: "Convergence Properties of The Nelder-Mead Simplex-Method in Low Dimensions", SIAM J. Optim, vol. 9, no. 1, pp. 112–47, 1998). The Nelder-Mead algorithm is available in MatLab, for example.

Between the coefficients $q_{n,PLL}$ (n=0, 1, . . . , N) of the denominator polynomial $Q_{PLL}(s)$ of the transfer function $H_{PLL}(s)$ of the phase locked loop on the one hand and the zeros $s_{\infty PLL,n}=s_N s_{\infty r,n}$ (n=1, 2, . . . , N) of the denominator polynomial $Q_{PLL}(s)$, i.e. the poles of the transfer function $H_{PLL}(s)$, on the other hand, there is a simple connection easily obtainable by multiplying the right side of the equation $$Q_{LF}(s) = q_{N-1,LF}s^{N-1} + q_{N-2,LF}s^{N-1} + q_{N-2,LF}s^{N-2} + \ldots + q_{1,LF}s = (s - s_{\infty PLL,1}) \cdot (s - s_{\infty PLL,2}) \cdot \ldots \cdot (s - s_{\infty PLL,N}).$$

In this manner, from the optimized poles $s_{\infty PLL,n} = s_N s_{\infty r,n}$ (n=1, 2, . . . , N) of the transfer function $H_{PLL}(s)$, the coefficients $q_{n,PLL}$ ((n=0, 1, . . . , N) of the denominator polynomial $Q_{PLL}(s)$ of the transfer function $H_{PLL}(s)$ of the locked loop are acquired.

From the coefficients $q_{n,PLL}$ (n=0, 1, . . . , N) of the denominator polynomial $Q_{PLL}(s)$ of the transfer function $H_{PLL}(s)$ of the locked loop, the coefficients $P_{n,LF}$ (n=0, 1) of the numerator polynomial $P_{LF}(s)$ and the coefficients $q_{n,LF}$ (n=1, 2, . . . , N–1) of the denominator polynomial $Q_{LF}(s)$ of the transfer function of the loop filter are acquired according to the equations already stated above $$p_{n,LF} = \frac{2\pi N_{frac}}{K_{VCO} I_p} q_{n,PLL} \quad (n = 0, 1)$$

and $$q_{n,LF} = q_{n+1,PLL} \quad (n = 1, 2, \ldots, N-1).$$

With this, the loop filter or the coefficients of its mathematical representation are completely determined. The calculation of the sizes of individual devices will exemplarily be described in greater detail further below on the basis of FIGS. 2 to 5.

Figure 1:
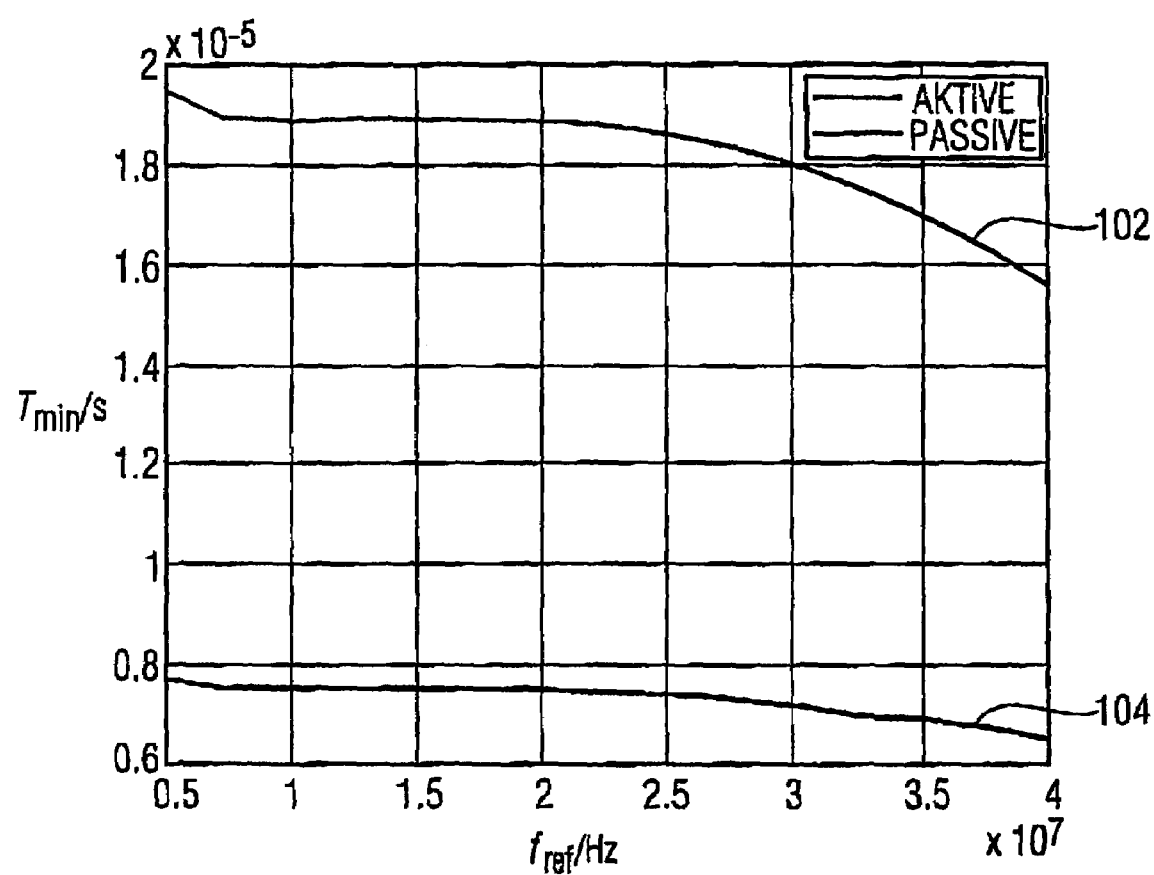
FIG. 1 is a schematic diagram illustrating the settling time of a frequency generator according to the invention.

In a schematic diagram, FIG. 1 shows the minimum settling times $T_{min}$ (ordinate) for phase locked loops with a conventional passive loop filter (curve 102, dotted) and with the inventive active loop filter (curve 104, solid) in dependence on the reference frequency $f_{ref}$ (abscissa). The conventional phase locked loop with a passive loop filter is a 5-th order type II phase locked loop. Both curves 102, 104 were calculated for a phase noise of –125 dBc/Hz@2.5 MHz, a modulus jump of $\Delta N_{frac}/N_{frac}=1/30$, $\Delta = x/(2^{B-1})=2$, and a frequency accuracy of $\alpha=20$ ppm. It can be seen that, over the entire region of the reference frequency $f_{ref}$ illustrated, the settling time for the conventional phase locked loop with a passive RC loop filter is more than twice as high than for the inventive phase locked loop with a pair of complex conjugated poles, which have been optimized as indicated above.

Figure 2:
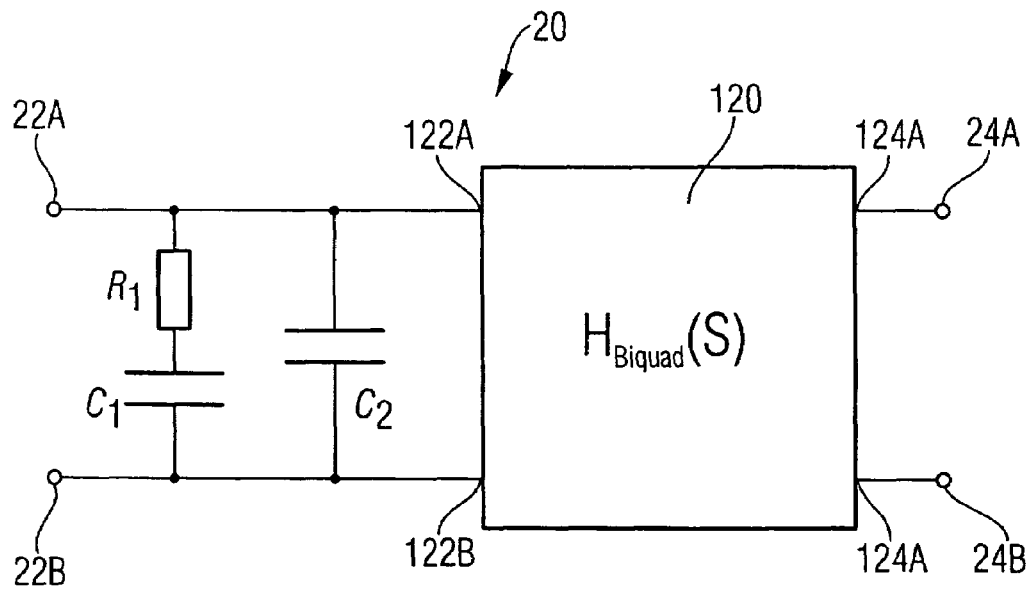
FIG. 2 is a schematic circuit diagram of a loop filter according to a preferred embodiment of the present invention.

FIG. 2 shows a schematic circuit diagram of a loop filter 20 according to a preferred embodiment of the present invention. The loop filter 20 is a fourth order filter with two real poles and a pair of complex conjugated poles. The real poles are realized out of a resistor $R_1$ and two capacitors $C_1$, $C_2$ with the aid of a passive RC filter. The resistor $R_1$ and the first capacitor $C_1$ are connected in series between the inputs 22a, 22b and the loop filter 20. The second capacitor $C_2$ is connected between the inputs 22a, 22b in parallel to the series circuit of the resistor $R_1$ and the first capacitor $C_1$. A biquad filter 120 is connected downstream of the passive RC filter of the resistor $R_1$ and the capacitors $C_1$, $C_2$, wherein inputs 122a, 122b of the biquad filter 120 are connected to the inputs 22a, 22b of the loop filter 20. Outputs 124a, 124b of the biquad filter 120 are connected to the outputs 24a, 24b of the loop filter 20. The transfer function $H_{biqad}(s)$ of the biquad filter 120 comprises the pair of complex conjugated poles.

Figure 3:
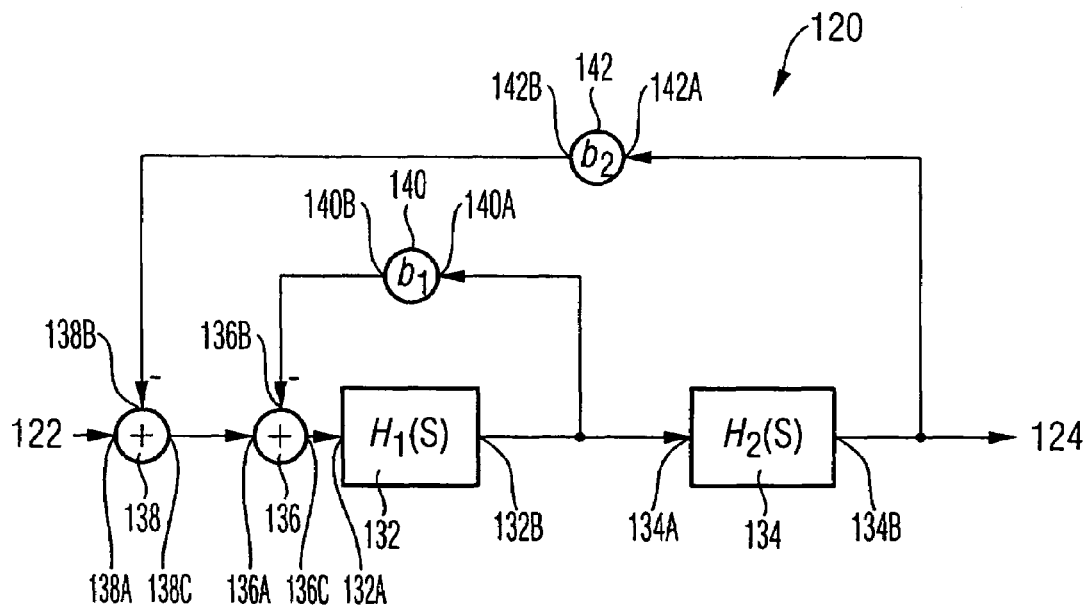
FIG. 3 is a schematic block circuit diagram of a biquad filter of a loop filter according to the present invention.

FIG. 3 is a schematic block circuit diagram of the biquad filter 120 from FIG. 2. The biquad filter 120 includes a first integrator 132 with the transfer function $H_1(s)$, a second integrator 134 with the transfer function $H_2(s)$, a first adder 136, a second adder 138, a first multiplier 140, and a second multiplier 142. A first input 138a of the second adder 138 is connected to the input 122 of the biquad filter 120. A second input 138b of the second adder 138 is connected to an output 142b of the second multiplier 142. An output 138c of the second adder 138 is connected to a first input 136a of the first adder 136. A second input 136b of the first adder 136 is connected to an output 140b of the first multiplier 140. An output 136c of the first adder 136 is connected to an input 132a of the first integrator 132. An output 132b of the first integrator 132 is connected to an input 140a of the first multiplier 140 and to an input 142a of the second integrator 134. An output 134b of the second integrator 134 is connected to an input 142a of the second multiplier 142 and the output 124 of the biquad filter 120.

In an idealized approximation, the integrators 132, 134 are ideal integrators, the transfer functions $H_{1,ideal}(s)$, $H_{2,ideal}(s)$ have the simple forms of $$H_{1,ideal}(s) \frac{a_1}{s}$$

and $$H_{2,ideal}(s) \frac{a_2}{s}.$$

Hence, $$H_{Biquad,ideal}(s) = \frac{K}{s^2 + \frac{\omega_0}{Q}s + \omega_0^2} = \frac{a_1 a_2}{s^2 + a_1 b_1 s + a_1 a_2 b_2}$$

applies, wherein Q is the quality and $\omega_0$ the resonance frequency of the biquad filter 120.

Ideal integrators, however, do not exist. In a first approximation to reality, the poles of the transfer functions $H_1(s)$, $H_2(s)$ are shifted from the origin along the real axis in the complex plane of numbers, $$H_1(s) \frac{a_1}{s + s_{\infty 1}}$$

and $$H_2(s) \frac{a_2}{s + s_{\infty 3}}.$$

Hence, $$H_{Biquad}(s) = \frac{a_1 a_2}{s^2 + (a_1 b_1 + s_{\infty 1} + s_{\infty 3})s + a_1 a_2 b_2 + a_1 b_1 s_{\infty 3} + s_{\infty 1} s_{\infty 3}}$$

applies.

From this equation, it can be recognized or derived that the quality Q of the biquad filter is upwardly limited, different from the case of ideal integrators. Furthermore, the resonance frequency $\omega_0$ is downwardly restricted and the direct current amplification diminished, namely the stronger, the closer the pole frequency of the integrators 132, 134 lies to the resonance frequency strived for.

From a comparison with the equation $$Q_{LF}(s) = q_{N-1,LF}s^{N-1} + q_{N-2,LF}s^{N-2} + \ldots + _{1,LF}s$$

already indicated above for the denominator polynomial of the transfer function $Z_{LF}(s)$ of the loop filter, simple connections between the coefficients $q_{n,LF}$ (n=0, 1, 2) of the denominator polynomial $Q_{LF}(s)$ of the transfer function $Z_{LF}(s)$ of the loop filter and the coefficients $a_1$, $a_2$, $s_{\infty 1}$, $s_{\infty 3}$ of the transfer functions $H_1(s)$, $H_2(s)$ of the (not ideal) integrators of which the biquad filter in this embodiment is constructed, determined according to the above-described method, result:

$$q_{2,LF}=1,$$

$$q_{1,LF}=a_1b_1+s_{\infty 1}+s_{\infty 3},$$

$$q_{0,LF}=a_1a_2b_2+a_1b_1s_{\infty 3}+s_{\infty 1}s_{\infty 3}$$

Apart from the fact that the pole of the transfer function of a real integrator cannot lie in the origin, the real transfer function of a real integrator is provided with additional parasitic poles and zeros.

Common requirements for microelectronic filters are small current consumption or small power demand, little noise, and sufficient linearity. For satisfying these requirements, the biquad filter 120 from FIGS. 2 and 3 is preferably constructed according to the current-mode technology, for example described in the article "Accurate CMOS Current-Mode-Filters for High Frequencies and Low Power Consumption" by N. Christoffers et al. (Konferenzband der ANALOG'02, pp. 343–48, Bremen 2002). The input voltage signal $U_{in}(s)$ of a current-mode biquad filter is at first converted to a current $I_{in}(s)=G_mU_{in}(s)$ by a transconductor with the transconductance $G_m$. By filtering, which is described by the transfer function $H_{biquad}(s)$ of the biquad filter, then a current output signal $I_{out}(s)=H_{biquad}(s)I_{in}(s)$ is determined or calculated from the current input signal $I_{in}(s)$. The output voltage $U_{out}(s)$ results from the output current $I_{in}(s)$ by renewed conversion, $U_{out}(s)=I_{out}(s)/G_m=H_{biquad}(s)U_{in}(s)$.

In the current-mode technology, the input and output signals of the integrators are currents. For this reason, the summation locations or the adders 136, 138 can be simplified to simple circuit nodes. According to Kirchoff's rule of nodes, a linear, noise-free and frequency-independent summation takes place without additional power demand.

Figure 4:
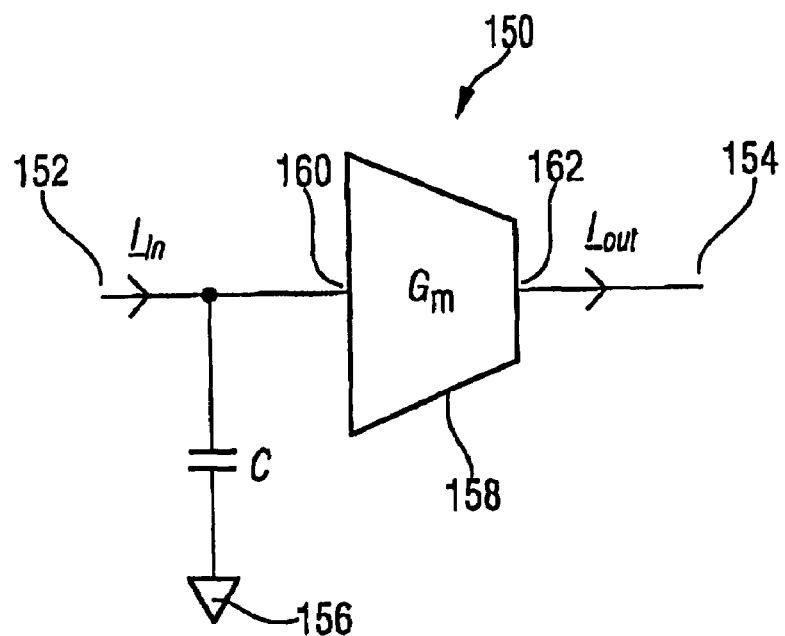
FIG. 4 shows a current-mode integrator of a loop filter according to the present invention.

FIG. 4 shows a schematic circuit diagram of an integrator 150 with an input 152 and an output 154 in current-mode technology. The integrator 150 includes a capacitor C connected between the input 152 and ground 156. The integrator 150 further includes a transconductor 158 with a transconductance $G_m$, which is switched between the input 152 and the output 154 of the integrator 150, i.e. an input of the transconductor 158 is connected to the input 152 of the integrator 150 and to the capacitor C, and an output 162 of the transconductor 158 is connected to the output 154 of the integrator. In case of an ideal transconductor 158, $$I_{out}(s) = \frac{G_m}{C} \frac{I_{in}(s)}{s}$$

then applies for the connection between the input current $I_{in}$ and the output current $I_{out}$.

Figure 5:
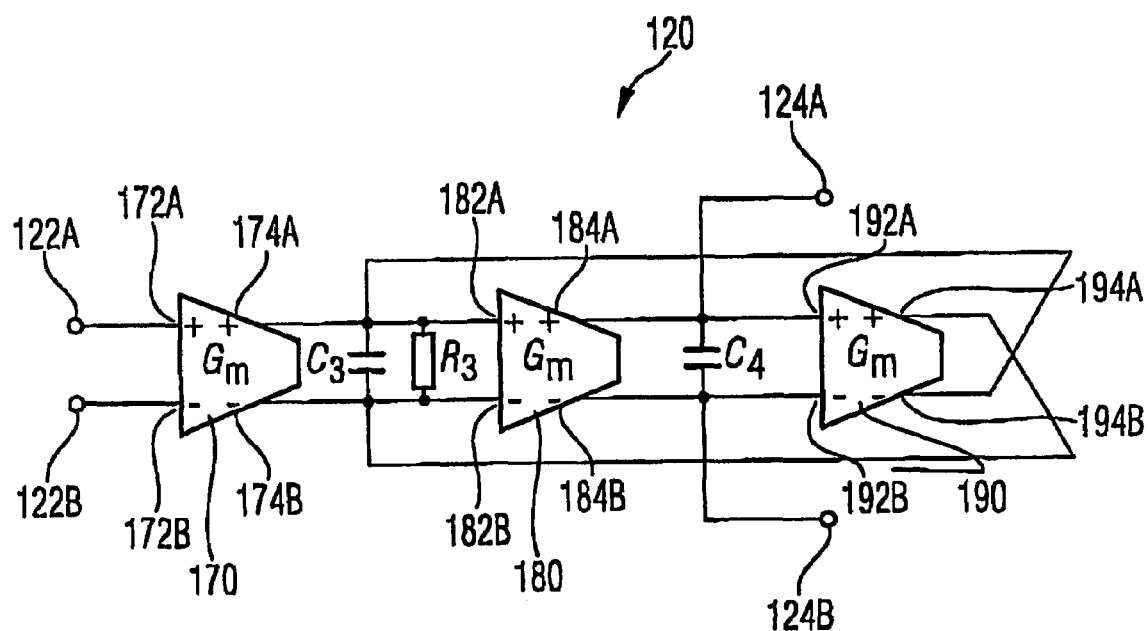
FIG. 5 shows a current-mode biquad filter of a loop filter according to a preferred embodiment of the present invention.

FIG. 5 is a schematic circuit diagram of the biquad filter 120 in current-mode technology. The biquad filter 120 includes a first transconductor 170 with inputs 172a, 172b connected to the inputs 122a, 122b of the biquad filter 120 and outputs 174a, 174b. A further transconductor 180 includes inputs 182a, 182b connected to the outputs 174a, 174b of the first transconductor 170 as well as outputs 184a, 184b. A third transconductor 190 includes inputs 192a, 192b connected to the outputs 184a, 184b of the second transconductor 180 and the outputs 124a, 124b of the biquad filter and outputs 194a, 194b cross-connected to the outputs 174a, 174b of the first transconductor 170 and the inputs 182a, 182b of the second transconductor. Furthermore, the biquad filter 120 includes a third capacitor $C_3$, the first electrode of which is connected to the first output 174a of the first transconductor 170, the first input 182a of the second transconductor 180, and the second output 194b of the third transconductor 190, and the second electrode of which is connected to the second output 174b of the first transconductor 170, the second input 182b of the second transconductor 180, and the first output 194a of the third transconductor 190. Furthermore, the biquad filter 120 includes a resistor $R_3$ connected in parallel to the third capacitor $C_3$. Furthermore, the biquad filter 120 includes a fourth capacitor $C_4$, the first electrode of which is connected to a first output 184a of the second transconductor 180, the second input 192a of the third transconductor 190, and the first output 124a of the biquad filter 120, and the second electrode of which is connected to the second output 184b of the second transconductor 180, the second input 192b of the third transconductor 190, and the second output 124b of the biquad filter 120.

All three transconductors 170, 180, 190 preferably comprise, as it is shown in FIG. 5, the same transconductance $G_m$. For the coefficients $a_1$, $a_2$, $b_1$, $b_2$ in the above-identified formulae for the transfer function $H_1(s)$, $H_2(s)$ of the integrator 132, 134 illustrated in FIG. 3 and in the transfer function $H_{biquad}(s)$ of the biquad filter 120, $a_1=G_m/C_3$, $a_2=G_m/C_4$, $b_1=1/(G_mR_3)$ and $b_2=1$. Furthermore, $$K = \omega_0 = \frac{G_m}{\sqrt{C_3C_4}} \text{ and}$$

$$Q = R_3C_3\omega_0$$

applies.

The maximum direct current amplification attainable of the current-mode biquad filter is 1. Since, in reality, both $s_{\infty 1}$ and $s_{\infty 3}$ are finite ($s_{\infty 1}>0$, $s_{\infty 3}>0$), the biquad filter 120 attenuates this signal passing through and deteriorates its signal to noise ratio. With a finite output resistance $R_{out}$ of each of three transconductors 170, 180, 190, $$s_{\infty 1} = \frac{1}{R_{out}C_3} \text{ and } s_{\infty 3} = \frac{1}{R_{out}C_4}$$

applies.

In order to minimize the attenuation of the signal passing through the biquad filter 120 and the deterioration of the signal to noise ratio, accordingly, an output resistance $R_{out}$ as great as possible is used.

If the above identities for the coefficients $a_1$, $a_2$, $b_1$, $b_2$ are set into the above-identified mathematical connections between the coefficients $q_{n,LF}$ ((n=1, 2) of the denominator polynomial $Q_{LF}(s)$ of the transfer function $Z_{LF}(s)$ of the loop filter and the coefficients $a_1$, $a_2$, $b_1$, $b_2$ of the transfer functions $H_1(s)$, $H_2(s)$ of the integrators, determined according to the above-described method, $$q_{2,LF}=1,$$

$$q_{1,LF}=a_1b_1+s_{\infty 1}+s_{\infty 3},$$

$$q_{0,LF}=a_1a_2b_2+a_1b_1s_{\infty 3}+s_{\infty 1}s_{\infty 3},$$

one will obtain the equations $$q_{2,LF} = 1,$$

$$q_{1,LF} = \frac{G_m}{C_3}\frac{1}{G_mR_3} + \frac{1}{R_{out}C_3} + \frac{1}{R_{out}C_4} = \frac{1}{C_3R_3} + \frac{1}{R_{out}C_3} + \frac{1}{R_{out}C_4}$$

$$q_{0,LF} = \frac{G_m}{C_3}\frac{G_m}{C_4} + \frac{G_m}{C_3}\frac{1}{G_mC_3}\frac{1}{R_{out}C_4} + \frac{1}{R_{out}C_3}\frac{1}{R_{out}C_4}$$

$$= \frac{G_m^2}{C_3C_4} + \frac{1}{C_3^2 R_{out}C_4} + \frac{1}{R_{out}^2 C_3 C_4}.$$

These equations provide a direct connection between the coefficients $q_{0,LF}=1$, $q_{1,LF}=1$, $q_{2,LF}$ of the denominator polynomial $Q_{LF}(s)$ of the transfer function $Z_{LF}(s)$ of the loop filter on the one hand and the transconductance $G_m$ of the transconductors and the resistances $R_3$, $R_4$, Rout and capacitances $C_3$, $C_4$ on the other hand, which are acquired as described above. In a last synthesis step, thus, from these equations and the equations $$K = \omega_0 = \frac{G_m}{\sqrt{C_3C_4}} \text{ and}$$

$$Q = R_3C_3\omega_0,$$

the device sizes $G_m$, $R_3$, $R_4$, $R_{out}$, $C_3$, $C_4$ for the construction of the inventive biquad filter are acquired.

Figure 6:
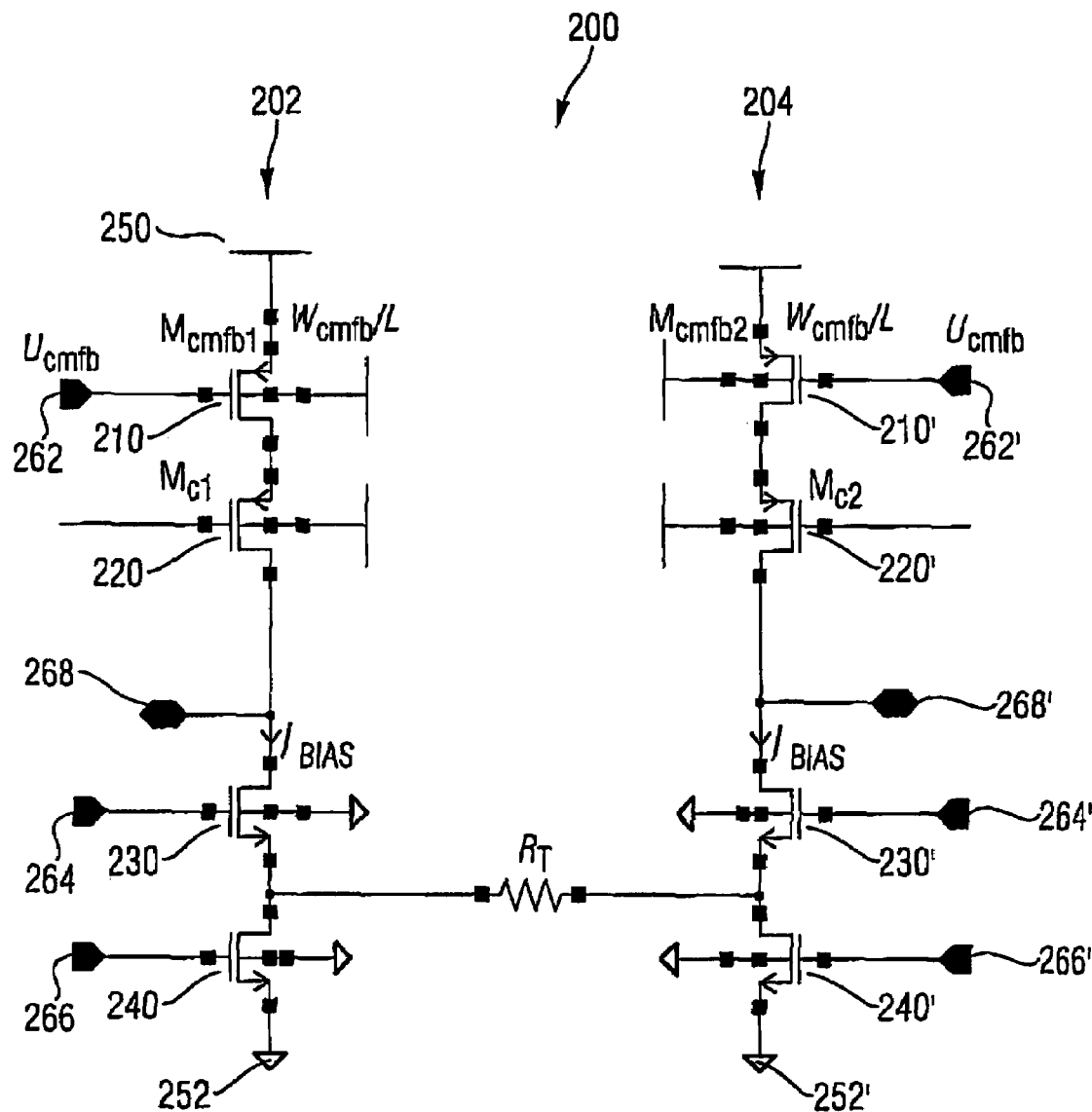
FIG. 6 is a schematic circuit diagram of a transconductor from FIG. 5.

Typical device sizes of the devices from FIGS. 2 to 6 are: $G_m$=7.5 µS, $R_1$=66.3 kΩ, $R_3$=137 kΩ, $R_T$=100 kΩ, $C_1$=118 pF, $C_2$=14 pF, $C_3$=$C_4$=7.5 pF. The pole quality typically lies in the order of magnitude of 0.1 to 1, the pole frequency typically lies in the range of some 10 kHz. FIG. 6 is a schematic circuit diagram showing a transconductor 200 according to a preferred embodiment of the present invention. The transconductor 200, for example, can be used as one of the transconductors 170, 180, 190 from FIG. 5. The transconductor 200 is constructed according to the principle of a degenerated differential amplifier. In order to be able to use capacitors $C_3$, $C_4$ with as-small-as-possible capacitances and therefore as-small-as-possible space requirements in an integrated circuit, a transconductance $G_m$ in the range of a few µS is strived for. So small transconductances are hard to achieve with transistors in strong inversion. Transistors in weak inversion only have small output resistances and are therefore unsuited in view of the present object. Instead, a high transconductance $G_m$ of the transistors used is adjusted. With the aid of a negative feedback by a resistor $R_T$, the transconductance $G_m$ of the transconductor 200 is set to $$G_m = \frac{g_m}{1 + R_T(g_m + g_{mbs})}$$

wherein $g_{mbs}$ is the bulk-source transconductance of the transistor as result of the substrate effect.

The transconductor 200 has a substantially symmetrical construction of two substantially symmetrical branches 202, 204. The first branch 202 includes four field-effect transistors 210, 210, 230, 240, the channels or source-drain paths of which are connected between a supply voltage terminal 350 and a ground terminal 253. The source of the first field-effect transistor 210 is connected to the supply voltage terminal 250, the drain of the first field-effect transistor 310 is connected to the source of the second field-effect transistor 320. The drain of the second field-effect transistor 220 is connected to the drain of the third field-effect transistor 230, the source of the third field-effect transistor 230 is connected to the drain of the fourth field-effect transistor 240, and the source of the fourth field-effect transistor 240 is connected to the ground terminal 252. The cascode circuit of the first field-effect transistor 210 and the second field-effect transistor 220 serves for the generation of an especially high output resistance of the transconductor 200, wherein a voltage $U_{cmfb}$ is applied to the gate of the first field-effect transistor 210 via a first input 266 from a common-mode regulation described further below with reference to FIG. 7. A second input 264 corresponds to one of the inputs 172a, 172b, 182a, 182b, 192a, 192b in the transconductors 170, 180, and 190 from FIG. 5, respectively, and is connected to the gate of the third field-effect transistor 230. The bias current $I_{BIAS}$, which is the drain current of the third field-effect transistor 30, is controlled via the second input 264. A third input 266 is connected to the gate of the fourth field-effect transistor 240 and forms an auxiliary input, the function of which will not be gone into in greater detail in the following. The drain of the second field-effect transistor 220 and the drain of the third field-effect transistor 230 are connected to an output 268 corresponding to one of the outputs 174a, 174b, 184a, 184b, 194a, 194b of the transconductors 170, 180, and 190 from FIG. 5, respectively.

The second branch 204 of the transconductor 200 is constructed symmetrically to the first branch 202. The devices of the second branch 204 were given the same reference numerals as the corresponding devices of the first branch 202, but supplemented by an apostrophe ('). The source of the third field-effect transistor 230 of the first branch 202 and the drain of the fourth field-effect transistor 240 of the first branch 202 on the one hand and the source of the third field-effect transistor 230' of the second branch 204 and the drain of the fourth field-effect transistor 240' of the second branch 204 on the other hand are connected to each other via a resistor $R_T$.

For achieving high output resistance $R_{out}$ of the transconductor 200, the cascade $M_c/M_{cmfb}$ of the first field-effect transistor 210 and the second field-effect transistor 220 (the index "cmfb" stands for "common-mode feedback"; the parameter L stands for the gate length of the field-effect transistor) is used as load for the third field-effect transistor 230. As a further measure for a high output resistance $R_{out}$ of the transconductor, an output common-mode regulation is chosen, which does not resistively load the output 268, 268'.

Figure 7:
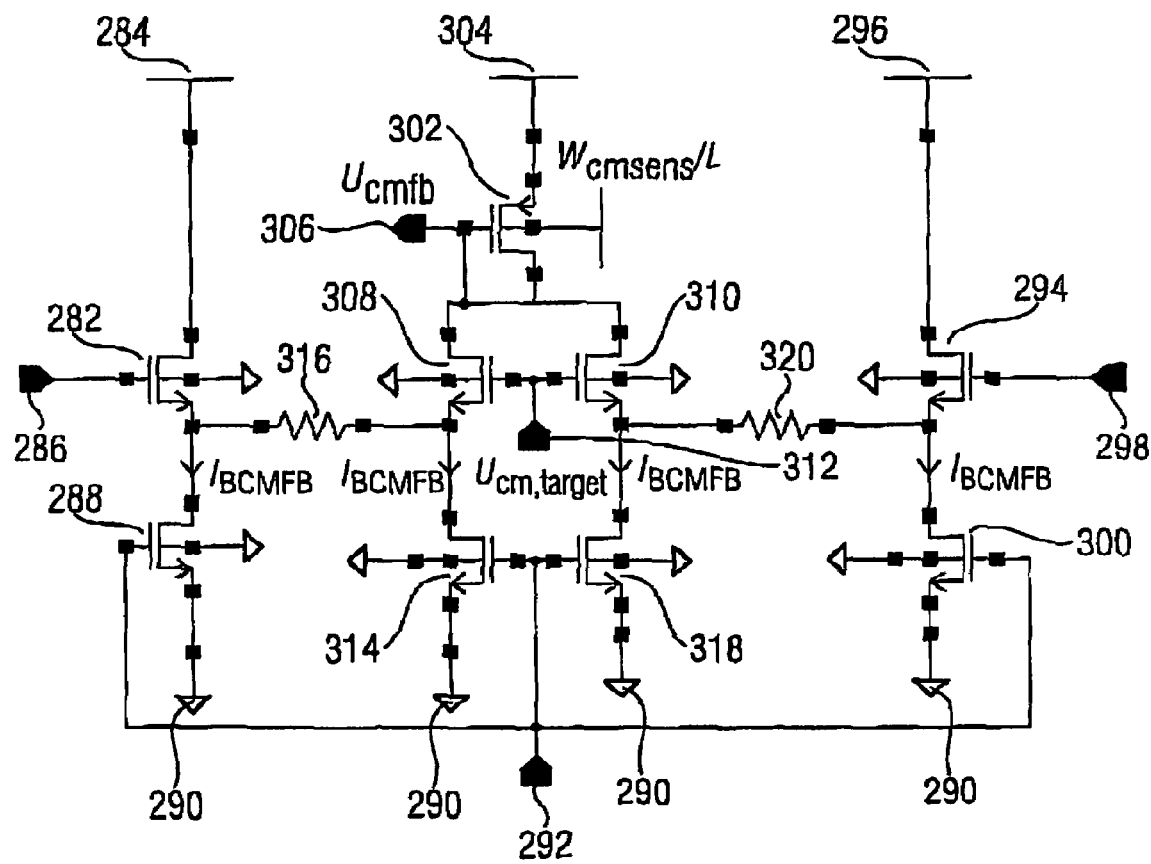
FIG. 7 is a schematic circuit diagram of an output common-mode regulation for the transconductor from FIG. 6.

FIG. 7 is a schematic circuit diagram of an output common-mode circuit for the transconductor from FIG. 6. The output common-mode circuit includes a first field-effect transistor 282, the drain of which is connected to a first supply voltage terminal 284, the gate of which is connected to a first input 286, and the source of which is connected to the drain of a second field-effect transistor 288. The source of the second field-effect transistor 288 is connected to ground 290, and the gate of the second field-effect transistor 288 is connected to a second input 292. The drain of a third field-effect transistor 294 is connected to a second supply voltage terminal 296, the gate of the third field-effect transistor 294 is connected to a third input 298, and the source of the third field-effect transistor 294 is connected to the drain of a fourth field-effect transistor 300. The source of the third field-effect transistor 300 is connected to ground 290, and the gate of the fourth field-effect transistor 300 is, just like the gate of the second field-effect transistor 288, connected to the second input 292. The source of a fifth field-effect transistor 312 is connected to a third supply voltage terminal 304, the gate and the drain of the fifth field-effect transistor 302 are connected to each other and to an output 306, the drain of a sixth field-effect transistor 308 and the drain of a seventh field-effect transistor 310. The gate of the sixth field-effect transistor 308 and the gate of the seventh field-effect transistor 310 are connected to each other and to a fourth input 312. The source of the sixth field-effect transistor 308 is connected to the drain of an eighth field-effect transistor 314 and to the source of the first field-effect transistor 282 and to the drain of the second field-effect transistor 288 via a resistor 316. The source of the seventh field-effect transistor 310 is connected to the drain of a ninth field-effect transistor 318 and to the source of the third field-effect transistor 294 and the drain of the fourth field-effect transistor 300 via a resistor 320. The gate of the eighth field-effect transistor 314 and the gate of the ninth field-effect transistor 318 are, just like the gate of the second field-effect transistor 288 and the gate of the fourth field-effect transistor 300, connected to the second input 292. The source of the eighth field-effect transistor 314 and the source of the ninth field-effect transistor 318 are connected to ground. Apart from the fifth field-effect transistor 302, all field-effect transistors 282, 288, 294, 300, 308, 310, 314, 318 are formed in substrate regions or wells connected to ground 290. The fifth field-effect transistor 302 is formed in a substrate region or in a well connected to a fourth supply voltage terminal 322.

A voltage $U_{cm,target}$ is present at the fourth input 312. The drain currents of the second field-effect transistor 288, of the fourth field-effect transistor 300, of the eighth field-effect transistor 314, and of the ninth field-effect transistor 318 are each $I_{BCMFB}$. At the output 306, the output common-mode regulation generates a voltage $U_{cmfb}$, which is applied to the first input 262, 262' of the two branches 202, 204 of the transconductor from FIG. 6.

For the output common mode $U_{cmout}(s)$ $$U_{cmout}(s) = \frac{\Delta I(s) - I_{BIAS} + \frac{U_{dd}}{Z_{Udd}(s)} + 2\frac{W_{cmfb}}{W_{cmsens}}I_{Bcmfb} - 2G_{mcm}\frac{W_{cmfb}}{W_{cmsens}}U_{cm,soll}}{\frac{Z_{Udd}(s) + Z_{gnd}(s)}{Z_{Udd}(s)Z_{gnd}(s)} + 2G_{mcm}\frac{W_{cmfb}}{W_{cmsens}}}$$

is found.

Here, $\Delta I(s)$ is a disturbance caused by the deviation of the input common mode from the target value, $U_{dd}$ the supply voltage, $Z_{udd}(s)$ the impedance between one of the two outputs and the supply voltage node, $Z_{gnd}(s)$ the impedance between the output 306 and the ground 219, and $G_{mcm}(s)$ the transconductance of an individual differential stage in the output common-mode regulation.

The greater the ratio $G_m W_{cmfb}/W_{cmsens}$, the better the output common mode may be regulated off. The voltage at the output of the transconductor 200, however, is not limited by the fact that a linear connection between $I_{cmsens}$ and the output common mode exists only for $$u_{out} \ll \frac{4I_{Bcmfb}}{G_{mcm}}.$$

At greater voltages, the output common-mode regulation fails.

Since the transconductor from FIG. 6 and the output common-mode regulation from FIG. 7 have to be adjusted so that $$I_{Bcmfb} \approx \frac{W_{cmsens}}{2W_{cmfb}}\left(I_{BIAS} - \frac{U_{dd}}{Z_{Udd}(s)}\right)$$

applies, $$G_m \frac{W_{cmfb}}{W_{cmsens}} \ll \frac{I_{BIAS} - \frac{U_{dd}}{Z_{Udd}(s)}}{u_{out}}.$$

For this reason, the output common-mode regulation becomes the weaker, the greater the maximum output amplitude is.

Figure 8:
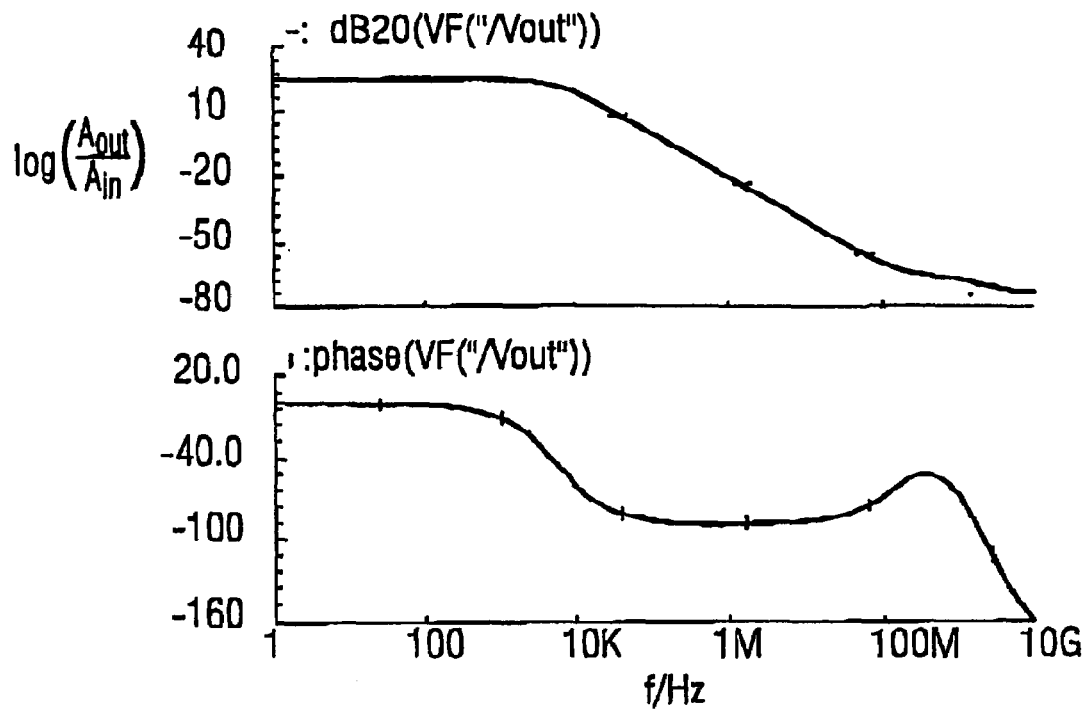
FIG. 8 is a schematic illustration of the transfer function of the transconductor.

FIG. 8 shows a Bode diagram of a simulated transfer function of a transconductor, as it is illustrated in FIG. 6. The transconductance $G_m$ of the transconductor is $G_m$=7.5 µS. Furthermore, in the simulation, a load capacitance of C=12.5 pF connected downstream of the outputs 268, 268' of the transconductor 200 was assumed. The frequency f of a harmonic signal present at the input 262, 262' of the transconductor 300 is associated with the abscissa in logarithmic graduation. With the ordinates, the "attenuation" of the transconductor 200 and the logarithmic ratio log ($A_{out}/A_{in}$) of the amplitude $A_{out}$ of the output signal output at the output 268, 268' and the harmonic signal $A_{in}$ (top) received at the input 262, 262' and the phase φ (bottom), respectively, are associated.

The frequency of the lowest-frequency pole of the transfer function lies at f=6 kHz. A zero and further poles lie at frequencies in the order of magnitude of some hundreds of MHz, and thus far outside the bandwidth strived for of the biquad filter to be formed with the transconductor. The current consumption of the transconductor 200 from FIG. 6 without the common-mode regulation from FIG. 7 is 30 µA.

Figure 9:
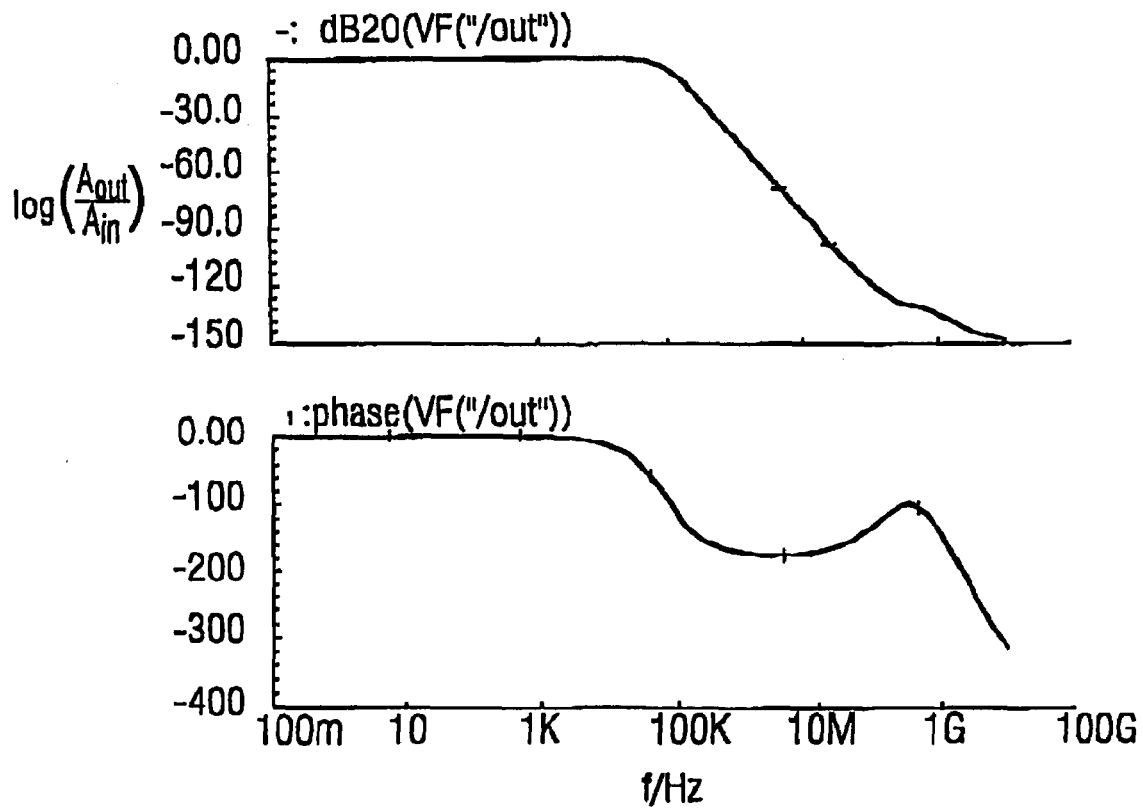
FIG. 9 is a schematic illustration of the transfer function of a biquad filter.

FIG. 9 is a schematic diagram showing the simulated transfer function of a biquad filter with transconductors, as they are illustrated in FIG. 6, in a Bode diagram. The frequency f of a harmonic input signal present at the input of the biquad filter is again associated with the abscissa. The attenuation of the biquad filter (log($A_{out}/A_{in}$) above) and the phase difference Δφ between the harmonic input signal present at the input of the biquad filter and the output signal present at the output of the biquad filter, respectively, are associated with the ordinate. The direct current amplification of the biquad filter, according to expectations, is only minus 0.1 dB. In the area of f≈70 kHz, there is the phase jump associated with the pole pair of the transfer function of the biquad filter, at which the phase difference changes by Δϕ=π=180°. At high frequencies f>>10 MHz, magnitude and phase of the transfer function take on great errors attributable to the additional poles and zeros.

The above statements show that, using biquad filters in a loop filter of a phase locked loop, the settling time T of a ΣΔ fractional-N frequency generator can be substantially shortened. Integrators and biquad filters in the current-mode technology distinguish themselves by small power demand, whereby also the power demand of the loop filter is comparably very small. The described transconductor is based on a degenerated differential amplifier. This enables a very small transconductance of the transconductor.

The above-described output common-mode regulation measures the output common mode with the aid of a resistive voltage splitter to avoid loading the output of the transconductor and enable high output resistance thereof. Instead, the output common mode is measured with the aid of two differential amplifiers. The output common-mode regulation achieved has great linearity.

In FIG. 9, it can be seen that undesired zeros and poles of the transfer function of the inventive biquad filter only occur at frequencies above about 100 MHz. This shows the versatile applicability of the current-mode biquad filters described.

The present invention can be implemented as a frequency generator, as a method of generating an oscillating output signal, and as a method, a computer program, and an apparatus for designing a frequency generator. The inventive computer program includes program code for performing the described inventive method of designing a frequency generator, wherein the method of designing is executed when the computer program is executed on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A frequency generator, comprising:
a phase locked loop with a loop filter,
wherein the loop filter is an active filter implemented as a biquad filter and is formed such that a transfer function of the loop filter has a pair of complex conjugated poles,
wherein transfer function $H_{PLL}(s)$ of the phase locked loop can be represented as quotient $H_{PLL}(s)=P_{PLL}(s)/Q_{PLL}(s)$ of a numerator polynomial $P_{PLL}(s)$ and a denominator polynomial $Q_{PLL}(s)=q_{N-1,PLL}s^{N-1}+q_{N-2,PLL}s^{N-2}+\ldots+q_{0,PLL}s^0$, wherein the transfer function $Z_{LF}(s)$ of the loop filter can be represented as quotient $Z_{LF}(s)=P_{LF}(s)/Q_{LF}(s)$ of a numerator polynomial $P_{LF}(s)=p_{1,LF}s+p_{0,LF}$ and a denominator polynomial $Q_{LF}(s)=q_{N-1,LF}s^{N-1}+q_{N-2,LF}s^{N-2}+\ldots q_{0,LF}s^0=(s-s_{\infty PLL,1})\cdot(s-s_{\infty PLL,2})\cdot\ldots\cdot(s-s_{\infty PLL,N})$ with the poles $s_{\infty PLL,n}$, and
wherein the filter is formed such that the poles $s_{\infty PLL,n}$ are chosen so that the phase noise of the phase locked loop has a predetermined value and the settling time of the phase locked loop is minimal.

2. The frequency generator of claim 1, wherein the phase locked loop comprises:
a phase/frequency detector with a differential signal input for receiving a reference signal with a reference frequency, a comparison signal input for receiving a comparison signal with a comparison frequency, and a control output for outputting an oscillator control signal, which depends on the difference between the comparison frequency and the reference frequency or on the difference of the phases of the comparison signal and of the difference signal;
the loop filter with an input for receiving the oscillator control signal and an output for outputting a filtered oscillator control signal;
an oscillator with an input for receiving the filtered oscillator control signal and an output for outputting an oscillating output signal with an output frequency, wherein the oscillator is formed to control the output frequency depending on the filtered oscillator control signal;
a frequency divider with an input for receiving the oscillating output signal and an output for outputting the comparison signal, wherein the frequency divider is formed so that the comparison frequency of the output comparison signal differs from the output frequency of the output signal received at the input by a frequency factor; and
an output for outputting the oscillating output signal.

3. The frequency generator of claim 2, wherein the frequency divider further comprises an input for receiving a frequency factor control signal and is formed so that the frequency factor is controllable by the frequency factor control signal.

4. The frequency generator of claim 3, further comprising:
a modulator with an input for receiving a digital signal representing a desired frequency factor and an output for outputting the frequency factor control signal, wherein the modulator is formed to switch the frequency factor of the frequency divider between different integer fractions of one, so that a temporal average of the frequency factor is equal to the desired frequency factor, when the desired frequency factor is not an integer fraction of one.

5. The frequency generator of claim 1, wherein the biquad filter includes transconductors with the transconductance $G_m$, capacitors with the capacitances $C_3$, $C_4$, and a resistor device with the resistance $R_3$ and has the amplification K and the quality Q, wherein the coefficients $q_{n,PLL}$, $P_{n,LF}$, $q_{n,LF}$, the transconductance $G_m$, the capacitances $C_3$, $C_4$ and the resistance $R_3$ satisfy the following equations:

$$q_{n,LF} = q_{n+1,PLL},$$

$$q_{1,LF} = \frac{1}{C_3 R_3} + \frac{1}{R_{out} C_3} + \frac{1}{R_{out} C_4},$$

$$q_{0,LF} = \frac{G_m^2}{C_3 C_4} + \frac{1}{C_3^2 R_{out} C_4} + \frac{1}{R_{out}^2 C_3 C_4},$$

$$K = \omega_0 = \frac{G_m}{\sqrt{C_3 C_4}}, \text{ and}$$

$$Q = R_3 C_3 \omega_0.$$

6. A method of generating an oscillating output signal with an output frequency from a reference signal with a reference frequency, comprising the steps of:

generating the oscillating output signal;

generating a comparison signal from the oscillating output signal, wherein a comparison frequency of the comparison signal differs from the output frequency by a frequency factor;

comparing the comparison frequency with the reference frequency or a phase of the comparison signal with a phase of the reference signal, in order to generate an oscillator control signal, which depends on the difference of the comparison frequency and the reference frequency or on the difference of the phase of the comparison signal and the phase of the reference signal;

filtering the oscillator control signal with a loop filter, the loop filter being an active filter implemented as a biquad filter, in order to obtain a filtered oscillator control signal, wherein the transfer function of the loop filter comprises a pair of complex conjugated poles, wherein the transfer function $H_{PLL}(s)$ of the phase locked loop can be represented as quotient $H_{PLL}(s)=P_{PLL}(s)/Q_{PLL}(s)$ of a numerator polynomial $P_{PLL}(s)$ and a denominator polynomial $Q_{PLL}(s)=q_{N-1,PLL}s^{N-1}+q_{N-2,PLL}s^{N-2}+\ldots+q_{0,PLL}s^0$, wherein the transfer function $Z_{LF}(s)$ of the loop filter can be represented as quotient $Z_{LF}(s)=P_{LF}(s)/Q_{LF}(s)$ of a numerator polynomial $P_{LF}(s)=p_{1,LF}s+p_{0,LF}$ and a denominator polynomial $Q_{LF}(s)=q_{N-1,LF}s^{N-1}+q_{N-2,LF}s^{N-2}+\ldots+q_{0,LF}s^0=(s-s_{\infty PLL,1})\cdot(s-s_{\infty PLL,2})\cdot\ldots\cdot(s-s_{\infty PLL,N})$ with the poles $s_{\infty PLL,n}$, and wherein the filter is formed such that the poles $s_{\infty PLL,n}$ are chosen so that the phase noise of the phase locked loop has a predetermined value and the settling time of the phase locked loop is minimal; and controlling the output frequency of the output signal depending on the filtered oscillator control signal.

7. A method of designing a frequency generator with a phase locked loop with a loop filter, comprising the steps of:

determining a maximum phase noise of the phase locked loop and a frequency offset, wherein the phase noise of the phase locked loop is to be no more than equal to the maximum phase noise at the frequency offset from a carrier frequency;

calculating a maximum magnitude of a transfer function $H_{PLL}(s)$ of the phase locked loop at the frequency offset from the maximum phase noise and the frequency offset;

determining a pair of complex conjugated poles of a transfer function $H_{LF}(s)$ of the loop filter so that the magnitude of the transfer function $H_{PLL}(s)$ of the phase locked loop for the determined pair of complex conjugated poles is equal to the maximum magnitude and the settling time of the phase locked loop is minimal; and outputting said determined pair of complex conjugated poles, whereby said loop filter of said designed frequency generator includes said determined pair of complex conjugated poles.

8. The method of claim 7, wherein the step of determining the pair of complex conjugated poles includes the steps of:

determining poles of a transfer function of the phase locked loop, for which the magnitude of the transfer function $H_{PLL}(s)$ of the phase locked loop is equal to the maximum magnitude and the settling time of the phase locked loop is minimal; and determining the pair of complex conjugated poles $s_{\infty PLL,n}$ of the transfer function $H_{LF}(s)$ of the loop filter from the poles of the transfer function $H_{PLL}(s)$ of the phase locked loop.

9. The method of claim 8, wherein the step of determining the pair of complex conjugated poles $s_{\infty PLL,n}$ of the transfer function of the phase locked loop comprises the steps of:

determining a reference location $s_N$, for which $$|H_{PLL}(2\pi\Delta f_{sp})| = \sqrt{S_{\phi\max}(\Delta f_{sp})\frac{3f_{ref}|1-z^{-1}|^2}{\Delta^2\pi^2|H_q(z)|^2}}$$

applies; and determining a set of relative locations $s_{\infty r,n}$ of the poles, for which a settling time of the phase locked loop is minimal, wherein the poles $s_{\infty PLL,n}$ of the transfer function $H_{PLL}(s)$ of the phase locked loop are products $s_{\infty PLL,n}=s_N s_{\infty r,n}$ of the reference location $s_N$ and the relative locations $s_{\infty r,n}$.

10. The method of claim 9, wherein the step of determining the reference locations includes a step of numerically optimizing.

11. The method of claim 10, wherein the step of numerically optimizing includes a step of numerically optimizing with the Nelder-Mead algorithm.

12. The method of claim 9, further comprising the steps of:

representing the transfer function $H_{PLL}(s)$ of the phase locked loop as quotient $H_{PLL}(s)=P_{PLL}(s)/Q_{PLL}(s)$ of a numerator polynomial $P_{PLL}(s)$ and a denominator polynomial $Q_{PLL}(s)=q_{N-1,PLL}s^{N-1}+q_{N-2,PLL}s^{N-2}+\ldots+q_{0,PLL}s^0$; and representing the transfer function $Z_{LF}(s)$ of the loop filter as quotient $Z_{LF}(s)=P_{LF}(s)/Q_{LF}(s)$ of a numerator polynomial $P_{LF}(s)=p_{1,LF}s+p_{0,LF}$ and a denominator polynomial $Q_{LF}(s)=q_{N-1,LF}s^{N-1}+q_{N-2,LF}s^{N-2}+\ldots+q_{1,LF}$, wherein the step of determining the pair of complex conjugated poles $s_{\infty PLL,n}$ further includes the steps of:

determining coefficients $q_{n,PLL}$ of the denominator polynomial of the transfer function $H_{PLL}(s)$ of the phase locked loop; and determining coefficients $q_{n,LF}$ of the denominator polynomial of the transfer function $Z_{LF}(s)$ of the loop filter from the coefficients $q_{n,PLL}$ of the denominator polynomial of the transfer function $H_{PLL}(s)$ of the phase locked loop from the following equations:

$$p_{n,LF} = \frac{2\pi N_{frac}}{K_{VCO}I_p}q_{n,PLL},$$

$$q_{n,LF} = q_{n+1,PLL}.$$

13. The method of claim 12, wherein the loop filter includes a biquad filter with transconductors with the transconductance $G_m$, capacitors with the capacitances $C_3$, $C_4$, and a resistor device with the resistance $R_3$ and has the amplification K and the quality Q, further comprising the step of:

determining the transconductance $G_m$, the capacitances $C_3$, $C_4$, and the resistance $R_3$ from the following equations:

$$q_{1,LF} = \frac{1}{C_3 R_3} + \frac{1}{R_{out}C_3} + \frac{1}{R_{out}C_4},$$

-continued $$q_{0,LF} = \frac{G_m^2}{C_3 C_4} + \frac{1}{C_3^2 R_{out} C_4} + \frac{1}{R_{out}^2 C_3 C_4},$$

$$K = \omega_0 = \frac{G_m}{\sqrt{C_3 C_4}} \text{ und}$$

$$Q = R_3 C_3 \omega_0.$$

14. The method as recited in claim 7 further comprising:
realizing the phase-locked loop with the loop filter, the loop filter having the determined pair of complex conjugated poles.

15. A computer-readable medium including a computer program with program code for performing, when the computer program is executed on a computer, the method of designing a frequency generator with a phase locked loop with a loop filter, said program code comprising the steps of:
determining a maximum phase noise of the phase locked loop and a frequency offset, wherein the phase noise of the phase locked loop is to be no more than equal to the maximum phase noise at the frequency offset from a carrier frequency;
calculating a maximum magnitude of a transfer function $H_{PLL}(s)$ of the phase locked loop at the frequency offset from the maximum phase noise and the frequency offset;
determining a pair of complex conjugated poles of a transfer function $H_{LF}(s)$ of the loop filter so that the magnitude of the transfer function $H_{PLL}(s)$ of the phase locked loop for the determined pair of complex conjugated poles is equal to the maximum magnitude and the settling time of the phase locked loop is minimal; and
outputting said determined pair of complex conjugated poles, whereby said loop filter of said designed frequency generator includes said determined pair of complex conjugated poles.

16. The computer-readable medium as recited in claim 15 further comprising computer code for:
realizing the phase-locked loop with the loop filter, the loop filter having the determined pair of complex conjugated poles.

17. An apparatus for designing a frequency generator with a phase locked loop with a loop filter, comprising:
a maximum phase noise determinator for determining a maximum phase noise of the phase locked loop and a frequency offset, wherein the phase noise of the phase locked loop is to be no more than equal to the maximum phase noise at the frequency offset from a carrier frequency;
a calculator for calculating a maximum magnitude of a transfer function of the phase locked loop at the frequency offset from the maximum phase noise and the frequency offset; and
a pole determinator for determining a pair of complex conjugated poles of a transfer function of the loop filter, for which the magnitude of the transfer function of the phase locked loop is equal to the maximum magnitude and the settling time of the phase locked loop is minimal.

18. A frequency generator, comprising:
a phase locked loop with a loop filter,
wherein the loop filter is formed such that a transfer function of the loop filter has a pair of complex conjugated poles; and
a modulator with an input for receiving a digital signal representing a desired frequency factor and an output for outputting the frequency factor control signal, wherein the modulator is formed to switch the frequency factor of the frequency divider between different integer fractions of one, so that a temporal average of the frequency factor is equal to the desired frequency factor, when the desired frequency factor is not an integer fraction of one.

19. A frequency generator, comprising:
a phase locked loop with a loop filter,
wherein the loop filter is formed such that a transfer function of the loop filter has a pair of complex conjugated poles, and
wherein the loop filter includes an active filter, which is a biquad filter, the biquad filter comprising transconductors.

* * * * *